United States Patent
Xu et al.

(10) Patent No.: US 9,698,305 B2
(45) Date of Patent: Jul. 4, 2017

(54) HIGH VOLTAGE LED FLIP CHIP

(71) Applicant: ENRAYTEK OPTOELECTRONICS CO., LTD., Shanghai (CN)

(72) Inventors: Huiwen Xu, Shanghai (CN); Yu Zhang, Shanghai (CN); Qiming Li, Shanghai (CN)

(73) Assignee: Enraytek Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 15/164,810

(22) Filed: May 25, 2016

(65) Prior Publication Data

US 2016/0365483 A1      Dec. 15, 2016

(30) Foreign Application Priority Data

Jun. 12, 2015   (CN) .......................... 2015 1 0323808

(51) Int. Cl.
*H01L 33/22*   (2010.01)
*H01L 33/00*   (2010.01)
(Continued)

(52) U.S. Cl.
CPC ............ *H01L 33/22* (2013.01); *H01L 33/007* (2013.01); *H01L 33/0095* (2013.01);
(Continued)

(58) Field of Classification Search
CPC ....................................................... H01L 33/22
See application file for complete search history.

(56) References Cited

U.S. PATENT DOCUMENTS 7,067,340 B1 *  6/2006  Tsai .................... H01L 33/0079
                                                         438/47
8,859,311 B2 * 10/2014  Lee ......................... H01L 33/62
                                                         257/91

(Continued)

FOREIGN PATENT DOCUMENTS

KR        101489537 B1    1/2015

OTHER PUBLICATIONS

Korean Intellectual Property Office, First Office Action re KR101489537B1, Jan. 17, 2017, Korean language and English summary, 7 pages.

*Primary Examiner* — Calvin Choi
*Assistant Examiner* — S. M. S Imtiaz
(74) *Attorney, Agent, or Firm* — Faegre Baker Daniels LLP

(57) ABSTRACT

A high voltage LED flip chip includes two or more regions; a Mesa-platform, the Mesa-platform in each region has a first groove; a first electrode located on the Mesa-platform, an area between the first electrodes in two adjacent regions forms a second groove; a first insulation layer covering the Mesa-platforms and the first electrodes, the first insulation layer fills the second groove and partially fills the first groove, and a part of the first groove which is not filled forms a third groove; a fourth groove formed in the first insulation layer, the fourth groove exposes a surface of the first electrode; and an interconnection electrode, the interconnection electrode comprises a first portion connecting the first semiconductor layer through the third groove in a particular region with the first electrode through the fourth groove in another region adjacent to the particular region. The LED formed has improved performance.

11 Claims, 11 Drawing Sheets

(51) Int. Cl.
*H01L 33/06* (2010.01)
*H01L 33/32* (2010.01)
*H01L 33/62* (2010.01)
*H01L 33/64* (2010.01)
*H01L 27/15* (2006.01)

(52) U.S. Cl.
CPC .............. *H01L 33/06* (2013.01); *H01L 33/32* (2013.01); *H01L 33/62* (2013.01); *H01L 33/647* (2013.01); *H01L 27/153* (2013.01); *H01L 33/0079* (2013.01); *H01L 2933/0016* (2013.01); *H01L 2933/0066* (2013.01); *H01L 2933/0075* (2013.01)

(56) References Cited

U.S. PATENT DOCUMENTS

| | | | | |
|---|---|---|---|---|
| 9,054,235 | B2 * | 6/2015 | Schubert | H01L 31/02 |
| 2002/0046874 | A1 * | 4/2002 | Cabral, Jr. | H01L 21/76843 174/137 R |
| 2006/0145347 | A1 * | 7/2006 | Aida | H01L 23/3677 257/758 |
| 2007/0126016 | A1 * | 6/2007 | Chen | H01L 33/0079 257/96 |
| 2009/0146165 | A1 * | 6/2009 | Hasnain | H01L 33/382 257/98 |
| 2009/0239324 | A1 * | 9/2009 | Chinone | H01L 33/0079 438/33 |
| 2011/0120553 | A1 * | 5/2011 | Watai | H01L 31/03762 136/256 |
| 2012/0043639 | A1 * | 2/2012 | Li | H01L 21/486 257/506 |
| 2012/0074441 | A1 * | 3/2012 | Seo | H01L 27/153 257/91 |
| 2012/0119243 | A1 * | 5/2012 | Kim | H01L 33/38 257/98 |
| 2012/0261702 | A1 * | 10/2012 | Su | H01L 33/007 257/98 |
| 2012/0273751 | A1 * | 11/2012 | Chang | H01L 33/20 257/13 |
| 2013/0221387 | A1 * | 8/2013 | Chang | H01L 33/20 257/98 |
| 2013/0292640 | A1 * | 11/2013 | Xiao | H01L 33/0079 257/13 |
| 2014/0306247 | A1 * | 10/2014 | Lee | H01L 33/387 257/88 |
| 2015/0179884 | A1 * | 6/2015 | Kang | H01L 33/60 257/98 |
| 2016/0163941 | A1 * | 6/2016 | Seo | H01L 27/153 257/93 |
| 2016/0293809 | A1 * | 10/2016 | Huang | H01L 33/58 |

* cited by examiner

HIGH VOLTAGE LED FLIP CHIP

CROSS-REFERENCE TO RELATED APPLICATIONS

This application claims the benefit of priority to Chinese Patent Application No. 201510323808.8, filed on Jun. 12, 2015, the entire disclosure of which is incorporated herein by reference.

TECHNICAL FIELD

The present disclosure generally relates to semiconductor manufacturing field, and more particularly, to a high voltage LED flip chip.

BACKGROUND

LED (Light Emitting Diode) is a semiconductor luminous device. Generally, the LED chip consists of multiple compounds, such as compound of Ga (Gallium) and As (Arsenic), compound of Ga and P (Phosphorus), compound of Ga and N (Nitrogen), or compound of Ga and In (Indium). The LED chip is developed based on electroluminescence phenomenon of semiconductor PN junction. The LED chip features good photoelectric performances, such as low power consumption, small volume, long life span, high stability, fast starting and stable light wave length. Therefore, LED has been widely used in various fields, such as illumination, home appliance, display screen, indicator light, etc. Moreover, LED chip has become a preferable light source due to above features as well as advantages of no stroboflash and not easy to cause visual fatigue. With the development of the industry, LED chips with high efficiency, high-power and high-reliability are gradually in need. However, in the application side of LED chip, small-power or medium-power chips still occupy the main market. Only a few companies are involved in the manufacturing of high-power LED chips due to the problem of low yield of high-power LED chips.

Recently, more and more new types of LED chip emerge, among which high voltage LED chips and the flip chips are attracting wide interests. The high voltage LED chip is made by connecting multiple light emitting units in series, where the multiple light emitting units are made by dividing a conventional large-volume low-voltage LED chip. Current for driving the high voltage LED chip is far smaller than that for driving the large-volume low-voltage LED chip, thus the high voltage LED chip has the advantages of low package cost, high drive power source efficiency, low wire loss, etc. Further, the flip chip has the advantages of wireless welding and high performance in heat dissipation.

Currently, for high-voltage LED, interconnection of electrodes is the key factor to affect the yield of chip, and for flip chips, packaging is a key factor to affect the yield of the flip chip. For more information about high voltage LED flip chip and its manufacturing process, Chinese Patent Applications No. CN104134744A and No. CN103022334A can be referred to.

SUMMARY

In one aspect of the present disclosure, a high voltage LED flip chip is provided, which has improved structural performance and package yield.

A high voltage LED flip chip includes two or more regions, the two or more regions include a first region where an upper electrode is to be formed and a second region where a lower electrode is to be formed; a Mesa-platform including a first semiconductor layer, a quantum well layer and a second semiconductor layer, the Mesa-platform in each of the two or more regions has a first groove; a first electrode located on the Mesa-platform, wherein an area between the first electrodes in two adjacent regions forms a second groove; a first insulation layer, wherein the first insulation layer covers the Mesa-platforms and the first electrodes, the first insulation layer fills the second groove and partially fills the first groove, and a part of the first groove which is not filled forms a third groove; a fourth groove formed in the first insulation layer, the fourth groove exposes a surface of the first electrode; and an interconnection electrode, wherein the interconnection electrode includes a first portion connecting the first semiconductor layer through the third groove in a particular region with the first electrode through the fourth groove in another region adjacent to the particular region.

Optionally, the interconnection electrode further includes a second portion connecting with the first semiconductor layer in the first region and a third portion connecting with the first electrode in the second region, wherein a fifth groove is formed between two adjacent portions of the interconnection electrode.

Optionally, the high voltage LED flip chip further includes a second insulation layer, the second insulation layer covers the interconnection electrode and fills the fifth groove; a sixth groove formed in the second insulation layer, the sixth groove exposes the interconnection electrode in the first region; and a second electrode, wherein the second electrode covers the second insulation layer and connects with the interconnection electrode through the sixth groove in the first region.

Optionally, the high voltage LED flip chip further includes a second insulation layer, wherein the second insulation layer covers the interconnection electrode and fills the fifth groove; a sixth groove formed in the second insulation layer, wherein the sixth groove exposes the interconnection electrode in the second region; and a second electrode, wherein the second electrode covers the second insulation layer and connects with the interconnection electrode through the sixth groove in the second region.

Optionally, the high voltage LED flip chip further includes a conductive plate located on the second electrode; a seventh groove formed between the two adjacent regions, wherein the seventh groove partitions the first semiconductor layers, the quantum well layers and the second semiconductor layers in different regions; and an eighth groove formed in the first semiconductor, wherein the eighth groove exposes the first electrode in the second region.

Optionally, the high voltage LED flip chip further includes a conductive plate located on the second electrode; a seventh groove formed between adjacent regions, wherein the seventh groove partitions the first semiconductor layers, the quantum well layers and the second semiconductor layers in different regions; and an eighth groove formed in the first semiconductor, wherein the eighth groove exposes the interconnection electrode in the first region.

Optionally, the high voltage LED flip chip further includes an extension electrode, wherein the extension electrode connects with the first electrode exposed by the eighth groove.

Optionally, the high voltage LED flip chip further includes an extension electrode, wherein the extension electrode connects with the interconnection electrode exposed by the eighth groove.

Optionally, the first semiconductor layer has a rough light-emitting surface.

Optionally, the interconnection electrode includes at least one material selected from a group consisting of Ag, Al, Rh, Cr, Pt, Au, Ti and Ni.

Optionally, the first insulation layer includes at least one material selected from a group consisting of $SiO_2$, SiN, SiON, $Al_2O_3$ and $TiO_2$.

Optionally, the second insulation layer includes at least one material selected from a group consisting of $SiO_2$, SiN, SiON, $Al_2O_3$ and $TiO_2$.

In comparison with existing technology, embodiments provided in the present disclosure have following advantages.

In the present disclosure, a first electrode is formed in each of the regions, and through the first insulation layer and the interconnect electrode, the first semiconductor layer in a particular region and the first electrode in a region adjacent to the particular region are connected, to form a basic frame of the high-voltage LED flip chip. The formation of the interconnection electrode fills corresponding grooves to electrically connect adjacent regions, therefore, metal wires can be avoided to connect adjacent regions, which improves structure performance and package yield of the high voltage LED flip chip.

Further, the entire second electrode, together with the conductive plate in connection with the second electrode, serves as an electrical connection terminal, thus conductivity and heat dispersion performance thereof are enhanced. In addition, packaging difficulty is lowered and package yield is improved.

DETAILED DESCRIPTION

In order to improve quality and integration level of a LED device, luminous efficacy per square centimeter (1 m/(W·cm$^2$)) is an important index for measuring quality of the LED device. The flip chip has good heat dissipation performance and current expanding ability, thus becoming a focus to meet the requirement of LED. Further, a high voltage LED flip chip made by connecting multiple LED flip chips in series, not only possesses improved luminous efficacy per square centimeter, but also possesses reduced driving cost, which becomes a future development trend of LED chips.

However, in existing high voltage LED flip chips, the P-electrode and the N-electrode are disposed on a same side of the chip, which is a high requirement for packaging technology and easy to cause low package yield. Moreover, in existing high voltage LED flip chips, thin metal wires are needed to bridge different regions, and the metal electrodes are required to overlay sidewall surface of the groove structure and outer surface of the protrusion structure. Chinese Patent Applications No. CN104134744A can be referred to for more information. For such a configuration, the interconnection metal wires on corner portion and step portion are easy to break, thus LED chip may go off in working. Further, interconnection bridged by metal wires is a high requirement in manufacturing due to the low yield rate. Recently, some solutions are developed for solving these problems, but the principle of the solutions are the same as before and the wielding spots are still relatively small, which is difficult for alignment in wielding.

Accordingly, embodiments of the present disclosure provide a high voltage LED flip chip and a method for manufacturing the high voltage LED flip chip, wherein an interconnection electrode is formed for connecting adjacent regions. As such, metal wires conventionally used are not needed, and structural performance and package yield thereof are improved.

In order to clarify the objects, characteristics and advantages of the present disclosure, embodiments of the present disclosure will be described in detail in conjunction with the accompanying drawings.

Referring to FIGS. 1 to 20, intermediate structures of a high voltage LED flip chip in a manufacturing method according to one embodiment of the present disclosure is illustrated.

Figure 1:
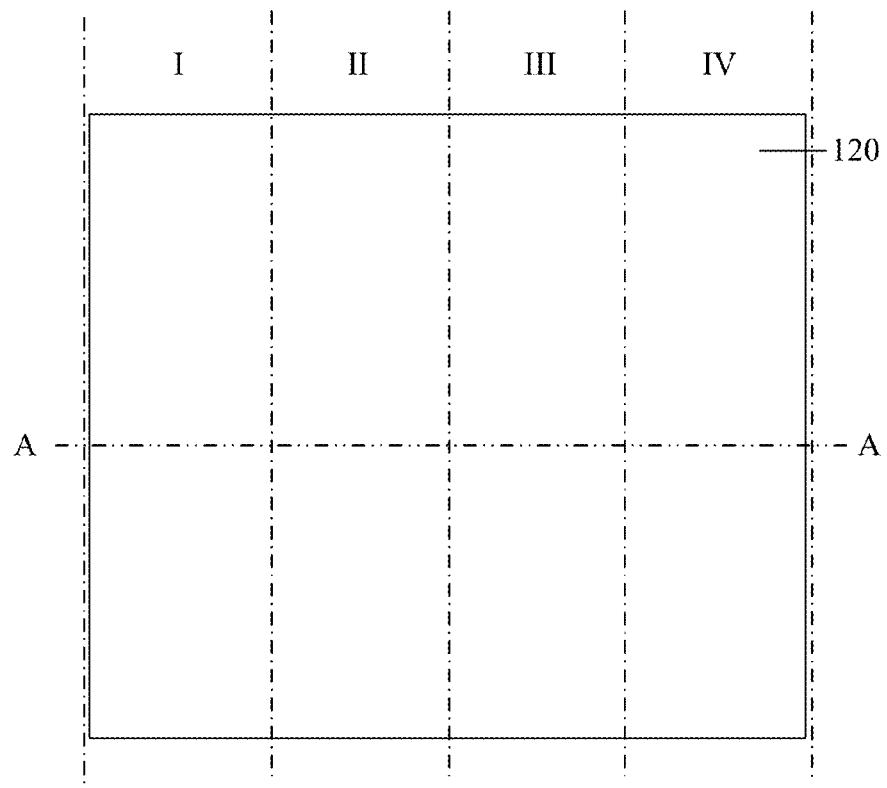
FIGS. 1 to 20 schematically illustrate intermediate structures of a high voltage LED flip chip in manufacturing according to one embodiment of the present disclosure.
Figure 2:
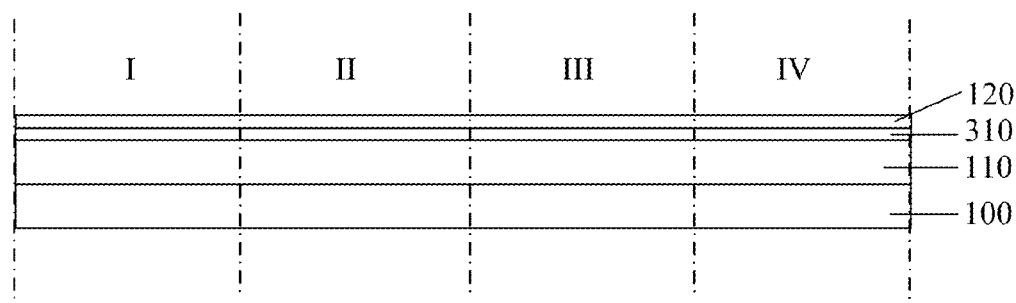

The method includes providing a substrate 100. As shown in FIGS. 1 and 2, the substrate 100 includes, schematically, four regions which are from left to right, a region I, a region II, a region III and a region IV, respectively. Further, an epitaxy stacking layer is formed on the substrate 100. The epitaxy stacking layer includes a first semiconductor layer 110, a quantum well layer 310 and a second semiconductor layer 120.

FIGS. 1 and 2 illustrate a same structure from different views. Specifically, FIG. 1 is a top view, and FIG. 2 is a corresponding sectional view along line A-A in FIG. 1.

Further, in FIGS. 1 and 2, five dotted lines are applied for indicating the four regions of the substrate 100 which are, from left to right, labeled as region I, region II, region III and region IV, respectively. A portion of the substrate 100 between two dotted lines is defined as one region. However, in order to simplify following illustration and indication, the regions on the following Figures are only indicated by three dotted lines. Accordingly, if the four or one of the four regions is mentioned in the description, please refer to FIGS. 1 and 2.

It should be noted that, in some embodiments of the present disclosure, the substrate 100 may include two, three, five or more regions. Number of the regions should not limit the scope of the protection.

In some embodiments, the substrate 100 may be a sapphire ($Al_2O_3$) substrate. In some embodiments, other substrate may be suitable for manufacturing LED chip according to the practical requirements. For example, the substrate 100 may be a substrate made of spinel ($MgAl_2O_4$), SiC, ZnS, ZnO or GaAs. In some embodiments, the first semiconductor layer 110 is an N-type semiconductor layer and the second semiconductor layer 120 is a P-type semiconductor layer. Specifically, the first semiconductor layer 110 may be an N-type doped GaN (Gallium Nitride) film. The N-type doped GaN film may have a doping concentration ranging from 5E17 cm$^{-3}$ to 1E19 cm$^{-3}$. The second semiconductor layer 120 may be a P-type doped GaN film. The second semiconductor layer 120 is grown on the quantum well layer 310. The second semiconductor layer 120 may be formed by doping a semiconductor layer. Further, hole concentration of the second semiconductor layer 120 may be improved by a doping process to improve the conductivity of the second semiconductor layer 120, so as to obtain a second semiconductor layer 120 with high quality, and thus improve the structural quality of the LED chip.

It should be noted that, in some embodiments of the present disclosure, the first semiconductor layer 110 may be a P-type semiconductor layer, such as a P-doped GaN film; while the second semiconductor layer 120 may be an N-type semiconductor layer, such as an N-doped GaN film. When the first semiconductor layer 110 is a P-type semiconductor layer and the second semiconductor layer 120 is an N-type semiconductor layer, material of the substrate 100 is suitable for growing the first semiconductor 110 thereon.

The quantum well layer 310 is also known as MQW (Multiple Quantum Well) active layer, or multiple-quantum-well layer. The quantum well layer 310 may include a narrow band-gap nitride film containing indium (not shown) and a wide band-gap nitride film (not shown), where the narrow band-gap nitride film and the wide band-gap nitride film are alternately stacked. In some embodiments, the narrow band-gap nitride film containing indium is InGaN film. The wide band-gap nitride film is GaN film. Temperature for forming the narrow band-gap nitride film may range from 700° C. to 900° C. Temperature for forming the wide band-gap nitride film may range from 700° C. to 900° C.

Figure 3:
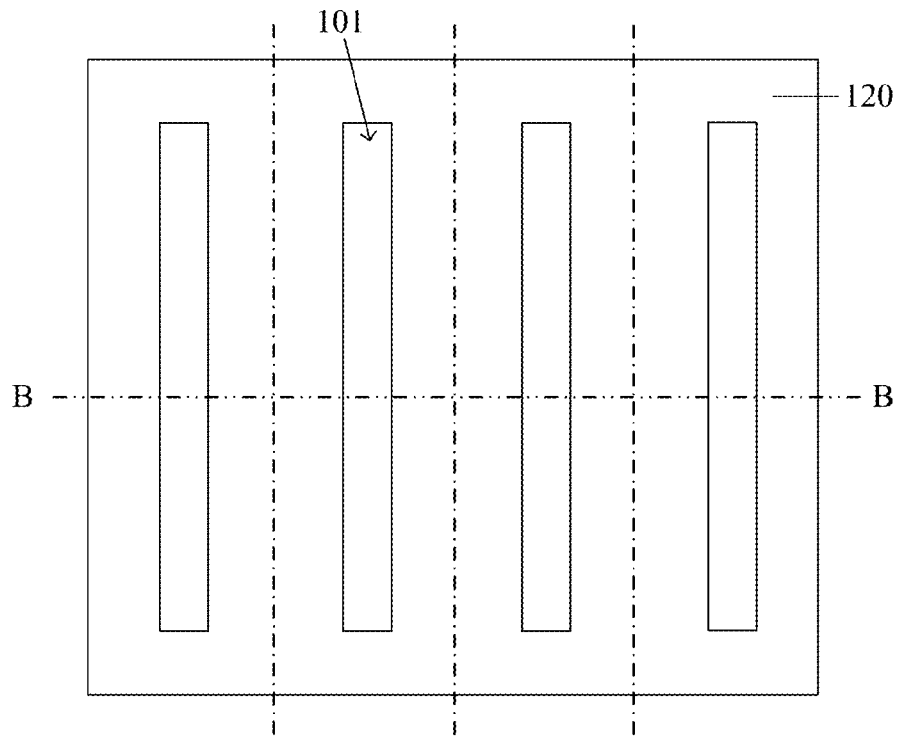
Figure 4:
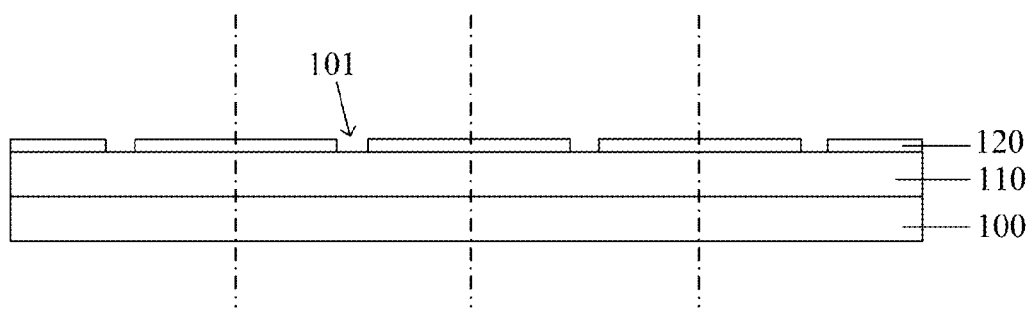

Referring to FIGS. 3 and 4, the method for manufacturing a high voltage LED flip chip further includes etching the epitaxy stacking layer for forming at least one first groove 101 at each region, wherein the first groove 101 exposes the first semiconductor layer 110 and a remaining portion of the epitaxy stacking layer in each region forms a Mesa-platform.

FIGS. 3 and 4 illustrate a same structure from different views. Specifically, FIG. 3 is a top view, and FIG. 4 is a corresponding section view along line B-B in FIG. 3.

In some embodiments, the first groove 101 is shaped in a rectangle from top, which is convenient for subsequent processes. Further, the first grooves 101 in different regions are made in same size and shape. In some embodiments, the first groove may take other shape from top, such as oval, or an irregular shape. Further, number of the first grooves 101, in each region, may be one or more. The number and the shape of the first grooves 101 can be changed.

As shown in FIG. 4, the first groove 101 penetrates the second semiconductor layer 120, but not penetrates the first semiconductor layer 110 and thus the first semiconductor layer 110 is exposed. It should be noted that, in practice, over etching may be performed to ensure the surface of the first semiconductor layer 110 to be exposed. That is to say, the first groove 101 may extend to the first semiconductor 110 for a certain extent.

In some embodiments, the Mesa-platform refers to a remaining portion of the epitaxy stacking layer after the epitaxy stacking layer has been etched to form the first groove 101. It should be noted that, a part of the first semiconductor layer 110 being exposed by the first groove 101 does not belong to the Mesa-platform.

In some embodiments, etching the second semiconductor layer 120 to form the first groove 101 and the Mesa-platform may include selectively etching the quantum well layer 310 and the second semiconductor layer 120 with plasma of $BCl_3$, $Cl_2$ or Ar, until the first semiconductor layer 110 is exposed.

In some embodiments, the Mesa-platform being formed during above etching process may have a slant sidewall. That is to say, the sidewall of the Mesa-platform may take an acute angle with the bottom surface, but an obtuse angle with the top surface. The slant sidewall of the Mesa-platform facilitates filling material therein in the subsequent processes. It should be noted that, in FIG. 4, both the angle between the bottom surface and the sidewall of the Mesa-platform and the angle between the top surface and the sidewall of the Mesa-platform are shown in a right angle, which is just for a brief illustration.

Figure 5:
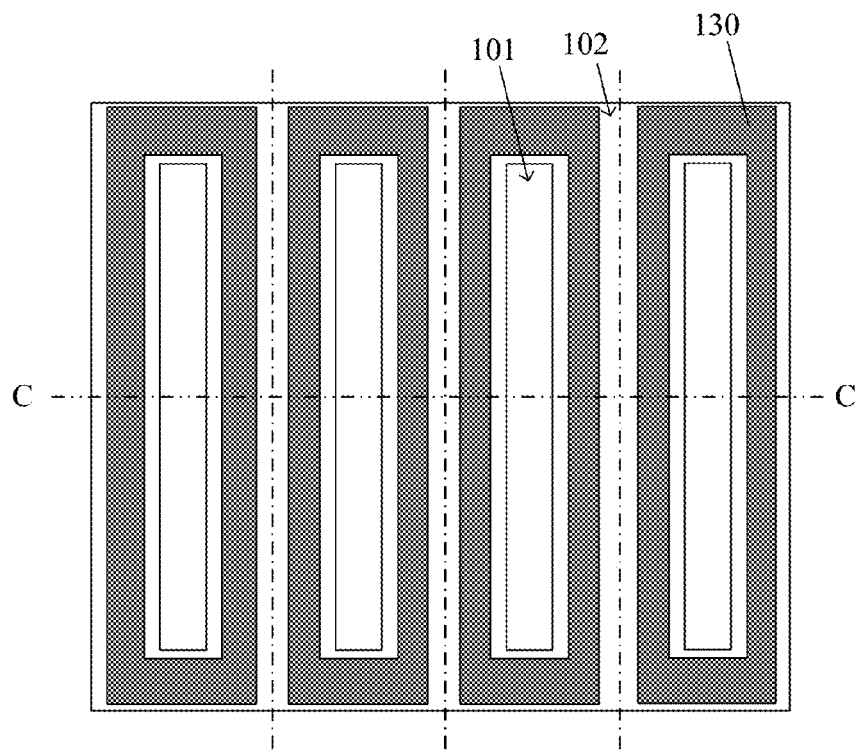
Figure 6:
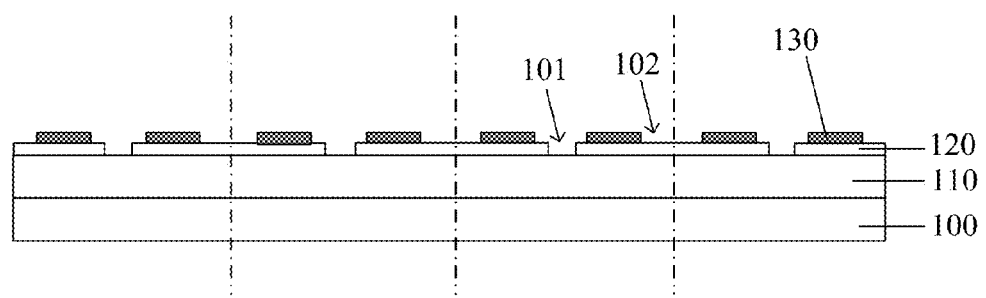

Referring to FIGS. 5 and 6, the method for manufacturing a high voltage LED flip chip further includes forming a first electrode 130 on the Mesa-platform in each region, wherein an area between the first electrodes 130 on two adjacent regions forms a second groove 102.

FIGS. 5 and 6 illustrate a same structure from different views. Specifically, FIG. 5 is a top view, and FIG. 6 is a corresponding section view along line C-C in FIG. 5.

In some embodiments, the first electrode 130 may include at least one material selecting from a group consisting of Ag, Al, Rh, Cr, Pt, Au, Ti and Ni. The first electrode 130 may have a single-layer structure or a multi-layer structure.

The two separate and independent first electrodes 130 in each region as shown in FIG. 6 actually belong to a common first electrode 130 which has a shape of rectangular ring. In other words, the two separate and independent electrodes 130 in each region as shown in FIG. 6 are sectional views of a common first electrode 130 at different parts.

It should be noted that, the first groove 101, as described above, may have various shapes from top. There may be any number of the first grooves. The first electrode 130 is formed on the Mesa-platform around the first groove 101, thus the first electrode 130 may have various corresponding shapes around the first groove 101. Further, the first electrode 130 is not formed in the first groove 101.

In some embodiments, the dotted lines between adjacent regions are within the second grooves 102. That is to say, the border between two adjacent regions located in the second groove 102.

Figure 7:
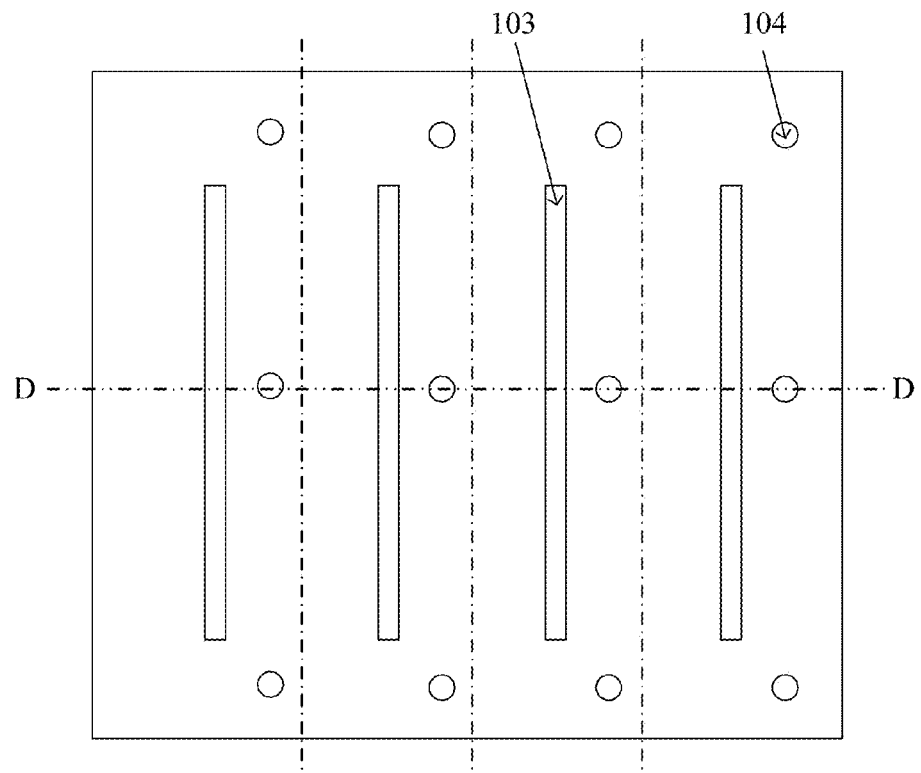
Figure 8:
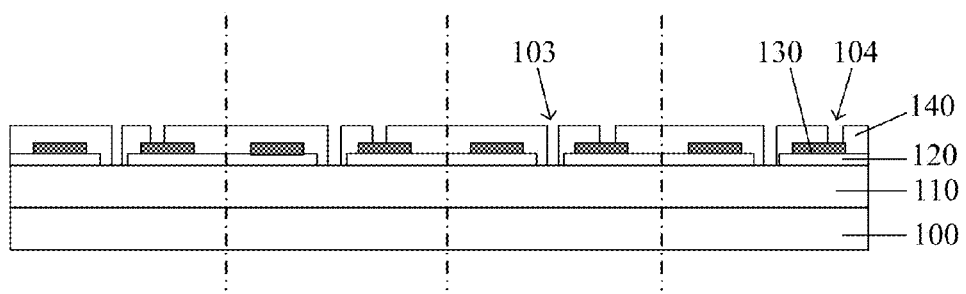

Referring to FIGS. 7 and 8, the method for manufacturing a high voltage LED flip chip further includes forming a first insulation layer 140, wherein the first insulation layer 140 covers the Mesa-platform and the first electrode 130 and fills the second groove 102 and partially fills the first groove 101, and a part of the first groove 101 which is not filled forms a third groove 103.

As shown in FIGS. 7 and 8, the method further includes etching the first insulation layer 140 to form at least one fourth groove 104, wherein the forth groove 104 exposes a surface of the first electrode 130.

FIGS. 7 and 8 illustrate a same structure from different views. Specifically, FIG. 7 is a top view, and FIG. 8 is a corresponding section view along line D-D in FIG. 7.

In some embodiments, the first insulating may include at least one material selected from a group consisting of $SiO_2$, SiN, SiON, $Al_2O_3$ and $TiO_2$. The first insulation layer 140 may be a single-layer structure or a multi-layer structure.

It should be noted that, a shape (e.g., from top) and number of the fourth grooves 104 formed on the first insulation layer 140 can be determined according to practical requirements. In some embodiments, the fourth groove 104 is shaped in a circle from top, as shown in FIG. 7. In some embodiments, the shape of the fourth groove 104 may be shaped in rectangle or any other shape. In some embodiments, the number of the fourth grooves 104 in each region is three, as shown in FIG. 7. In some embodiments, the number of the fourth grooves 104 in each region may be one, two, four or more. The fourth groove 104 in each region exposes a surface of the first electrode 103 in the corresponding region, but does not expose any other structure.

In some embodiments, the first groove 101 is partially filled with the first insulation layer 140 and a part of the first groove 101 which is not filled forms a third groove 103. It should be noted that, a width of the third groove 103 should be controlled, thus conductive material can be filled into the third groove 103 in the subsequent processes. In practice, the specific dimension of the third groove 103 can be adjusted and controlled according to a dimension of the LED flip chip.

In some embodiments, in order to partially fill the first groove 101 with the first insulation layer 140 and a part of the first groove 101 which is not filled serve as a third groove 103, following method may be applied: when forming the first insulation layer 140, the first groove 103 is fully filled with the first insulation layer 140; and when etching the insulation layer 140 to form the fourth groove 104, the insulation layer 140 in the first groove 101 is partially etched. Thus, the third groove 103 is formed at the same time of forming the fourth groove 104. That is, the first groove 101 is fully filled at first, and then the first insulation layer 140 in the first groove 101 is partially removed to form the third groove 103. Please note that the third groove 103 does not expose the side of the Mesa-platform and the first electrode.

It should be noted that, even the third groove 103 and the fourth groove 104 have different depths (e.g., as shown in FIG. 8, a depth of the third groove 103 is larger than that of the fourth groove 104), they can be formed by the same etching process. Specifically, the etching process being applied may have a high selection ratio of metal and insulating material. As the bottom part of the fourth groove 104 (i.e., the first electrode 130) is metal, the etching process can be implemented, after the fourth groove 104 is formed, for a while until the third groove 103 is formed without affecting the first electrode 130.

Figure 9:
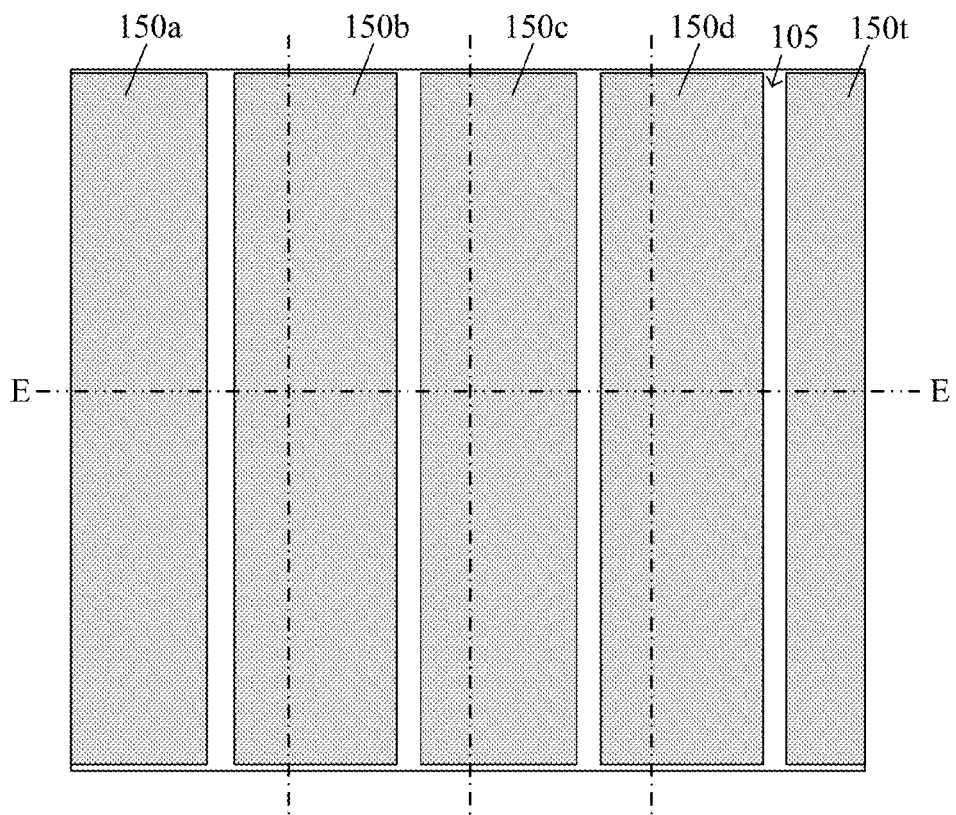
Figure 10:
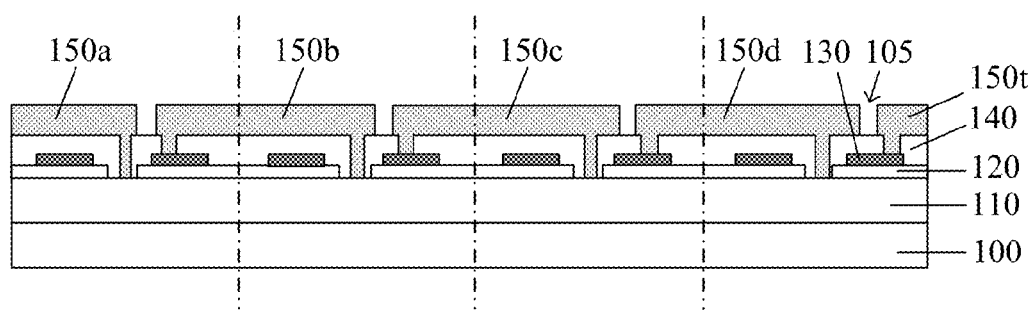

Referring to FIGS. 9 and 10, the method for manufacturing a high voltage LED flip chip further includes forming an interconnection electrode. In the embodiment of FIGS. 9 and 10, as there are four regions, number of the interconnection electrodes being formed is four as well. These four interconnection electrodes are respectively, from left to right, an interconnection electrode 150a, an interconnection electrode 150b, an interconnection electrode 150b and an interconnection electrode 150d.

In some embodiments, an area between two adjacent interconnection electrodes forms a fifth groove 105 which separates the interconnection electrodes.

In some embodiments, the interconnection electrode fills the third groove 103 and the fourth groove 104. Specifically, as shown in FIGS. 9 and 10, the interconnection electrode 150a fills the third groove 103 in the region I, the interconnection electrode 150b fills the fourth groove 104 in the region I and the third groove 103 in the region II, the interconnection electrode 150c fills the fourth groove 104 in the region II and the third groove 103 in the region III, the interconnection electrode 150d fills the fourth groove 104 in the region III and the third groove 103 in the region IV. Accordingly, one interconnection electrode fills the third groove 103 in one particular region and fills the fourth groove 104 in another region adjacent to the particular region. Thus, the electrode 130 in one region is connected with the first semiconductor layer 110 in an adjacent region through the interconnection electrode. In such a way, in the formed high voltage LED flip chip, the regions (i.e., the chip-units) are connected by the interconnection electrodes in series.

FIGS. 9 and 10 illustrate a same structure from different views. Specifically, FIG. 9 is a top view, and FIG. 10 is a corresponding section view along line E-E in FIG. 9.

From FIG. 10, it can be seen that, the interconnection electrode 150b connects the first electrode 130 in the region I and the first semiconductor layer 110 in the region II, the interconnection electrode 150c connects the first electrode 130 in the region II and the first semiconductor layer 110 in the region III, the interconnection electrode 150d connects the first electrode 130 in the region III and the first semiconductor layer 110 in the region IV. That is, each interconnection electrode connects the conductive structures (e.g., the first electrode 130 and the first semiconductor layer 110) in two adjacent regions.

Figure 13:
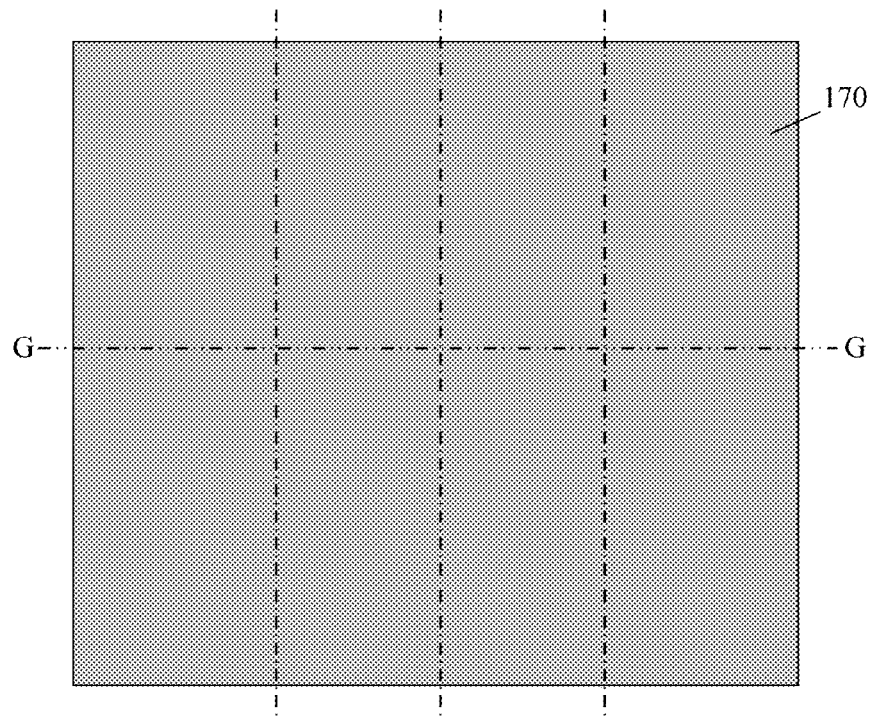
Figure 14:
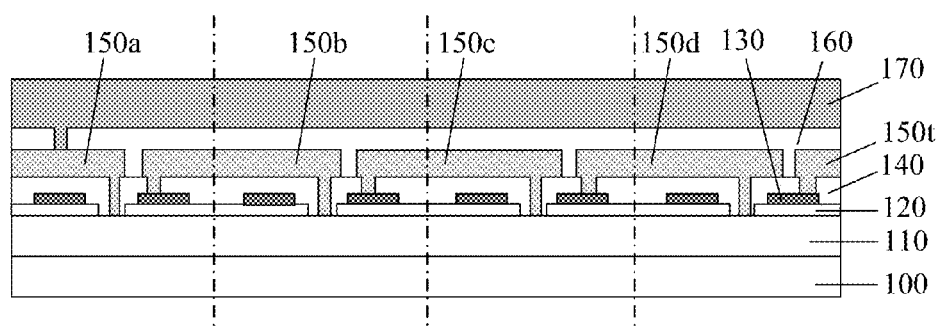

The interconnection electrode 150a is used for connecting with a second electrode (e.g., electrode 170 as shown in FIGS. 13 and 14) formed in the subsequent processes. Further, the interconnection electrode 150a is electrically connected with the first semiconductor layer 110 in the region I through the third groove 103 in the region I.

It should be noted that, in order to show a difference, the interconnection electrode (e.g., the interconnection electrodes 150b, 150c and 150d) connecting the electrode 130 in one region with the first semiconductor layer 110 in an adjacent region is defined as a first portion of the interconnection electrode. The interconnection electrode (e.g., the interconnection electrodes 150a) connecting with the first semiconductor layer 110 is defined as a second portion of the interconnection electrode.

It should be noted that, when a structure is described being located on a first side, it means that this structure is located on the corresponding region on the first side. Similarly, when a structure is described being located on a second side, it means that this structure is located on the corresponding region on the second side.

In some embodiments, a left side of the chip is defined as the first side, and a right side of the chip is defined as the second side.

In some embodiments, the interconnection electrode on the first side electrically connects with the first semiconductor 110 on the first side.

It should be noted that, in some embodiments, the interconnection electrode on the second side may electrically connect with the first semiconductor 110 on the second side.

In some embodiments, the interconnection electrode may include at least one material selected from a group consisting of Ag, Al, Rh, Cr, Pt, Au, Ti and Ni. The interconnection electrode may have a single-layer structure or a multi-layer structure.

In some embodiments, the interconnection electrode is formed by way of deposition, such as chemical vapor deposition.

It should be noted that, in some embodiments, the method for forming a high voltage LED flip chip further includes forming a level-up electrode 105t. In some embodiments, the level-up electrode 105t is formed during the process of forming the interconnection electrodes. In some embodiments, the level-up electrode and the interconnection electrode have a same material and a same forming process. The level-up electrode only serves as a fill-up structure located on the same layer with the interconnection electrodes, but does not serve as a structure for electrically connecting. In some embodiments, as shown in FIGS. 9 and 10, the level-up electrode 150t fills the fourth groove 104 in the region IV.

Further, when the level-up electrode 150t is not formed, the portion where the level-up electrode 150t locates in FIG. 10 will be void, and thus following drawbacks may exist. For example, structures which should not be connected may be connected, a portion which is supposed to form a groove may be unable to form a groove, and some structures may be unable to be tightly matched with each other, etc.

Therefore, the level-up electrode 150t is able to enhance structural compactness and integrity of the chip.

Figure 19:
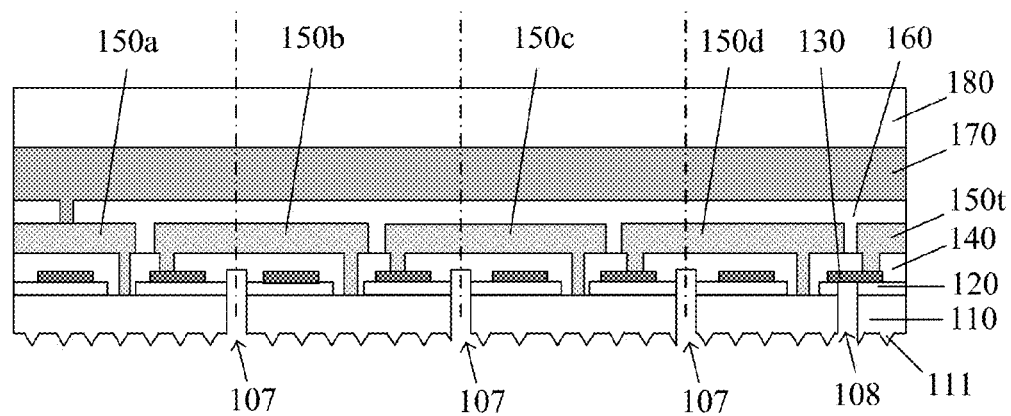

As shown in FIG. 10, the level-up electrode 150t is located on the second side. That is because, an extension electrode 190 (as shown in FIG. 19) formed in the subsequent processes is located on the first side (i.e., the left side). Thus, in order to make the interconnection electrode serve as electrical connection, and the level-up electrode does not serve as electrical connection, the level-up electrode 150t is required to be formed on the second side, specifically, the outmost portion of the chip on the second side.

It should be noted that, in some embodiments, the extension electrode 190 locates on the second side, while the level-up electrode 150t locates on the outmost portion of the first side.

In some embodiments, the level-up electrode 150t may include at least one material selected from a group consisting of Ag, Al, Rh, Cr, Pt, Au, Ti and Ni. The level-up electrode 150t may have a single-layer structure or a multi-layer structure.

Figure 11:
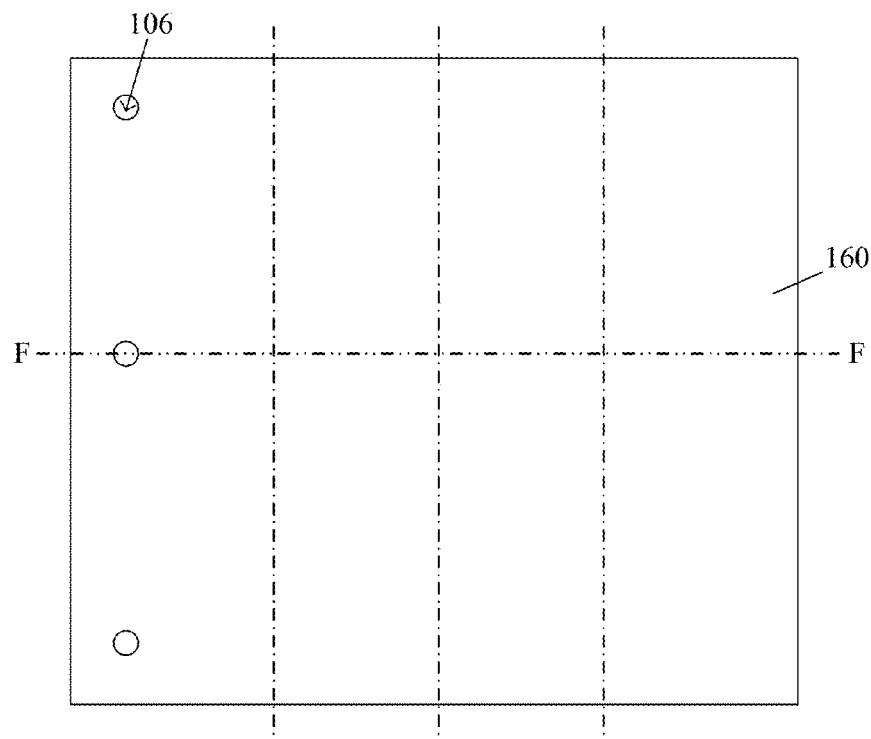
Figure 12:
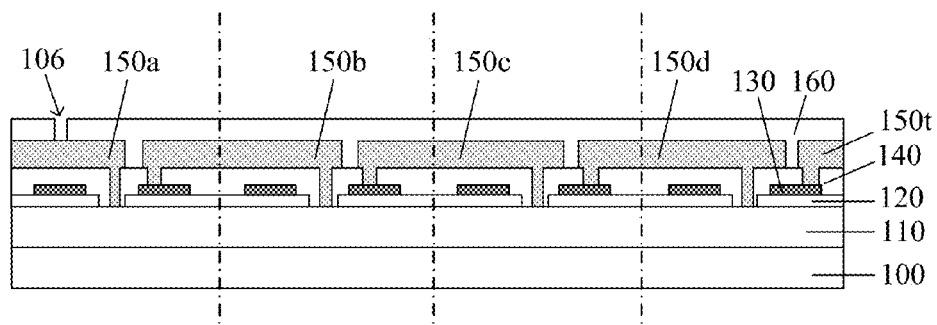

Referring to FIGS. 11 and 12, the method for forming a high voltage LED flip chip further includes forming a second insulation layer 160, wherein the second insulation layer 160 covers the interconnection electrodes and fills the fifth groove 105.

As shown in FIGS. 11 and 12, a sixth groove 106 is formed on the second insulation layer 160. The sixth groove 106 exposes the interconnection electrode 150a on the first side.

FIGS. 11 and 12 illustrate a same structure from different views. Specifically, FIG. 11 is a top view, and FIG. 12 is a corresponding section view along line F-F in FIG. 11.

In the embodiment as shown in FIG. 11, there are three sixth grooves 106 and the groove 106 is shaped in a circle from top. In some embodiments, the sixth groove may have a shape of rectangle or any other suitable shape. In some embodiments, the number of the sixth grooves may be one, two, four or more. Further, the sixth groove 106 exposes a surface of the interconnection electrode located on the first side, and does not expose any other structure.

In some embodiments, the sixth groove 106 may expose the interconnection electrode located on the second side. It should be noted that, the sixth groove 106 exposes the interconnection electrode on the first side or the interconnection electrode on the second side. That is to say, the sixth groove 106 exposes only one of the interconnection electrodes, where the interconnection electrode being exposed is the interconnection electrode in the region on the first side or the interconnection electrode in the region of the second side, but is not the interconnection electrode on any other region. For example, as shown in FIG. 12, the sixth groove 106 only exposes the interconnection electrode 150a in the region I of the high voltage LED, but does not expose the interconnection electrode in any other region.

From above, the sixth groove 106 exposes the second portion of the interconnection electrode (e.g., the interconnection electrode 150a), for forming an upper electrode of the high voltage LED.

In some embodiments, the second insulation layer 160 may include at least one material selected from a group consisting of $SiO_2$, SiN, SiON, $Al_2O_3$ and $TiO_2$. The second insulation layer 160 may have a single-layer structure or a multi-layer structure.

Referring to FIGS. 13 and 14, the method for manufacturing a high voltage LED flip chip further includes forming a second electrode 170, wherein the second electrode 170 covers the second insulation layer 160 and fills the sixth groove 106.

FIGS. 13 and 14 illustrate a same structure from different views. Specifically, FIG. 13 is a top view, and FIG. 14 is a corresponding section view along line G-G in FIG. 13.

In some embodiments, as shown in FIGS. 13 and 14, the second electrode 170 covers the second insulation layer 160 (i.e., a surface of the second insulation layer 160) completely and fully fills the sixth groove 106. Accordingly, an optical construction is formed by the second electrode 170 and the structures on the other layers (e.g., the second insulation layer 160, the first insulation layer 140). Type of the optical construction varies when different materials are used for forming the second electrode 170. For example, in some embodiments, the optical construction may be an ODR (Omni-Directional Reflector). In some embodiments, the optical construction may be a DBR (Distributed Brag Reflector).

In some embodiments, the second electrode 170 may include at least one material selected from a group consisting of Ag, Al, Rh, Cr, Pt, Au, Ti and Ni. The second electrode 170 may be a single-layer structure or a multi-layer structure.

Figure 15:
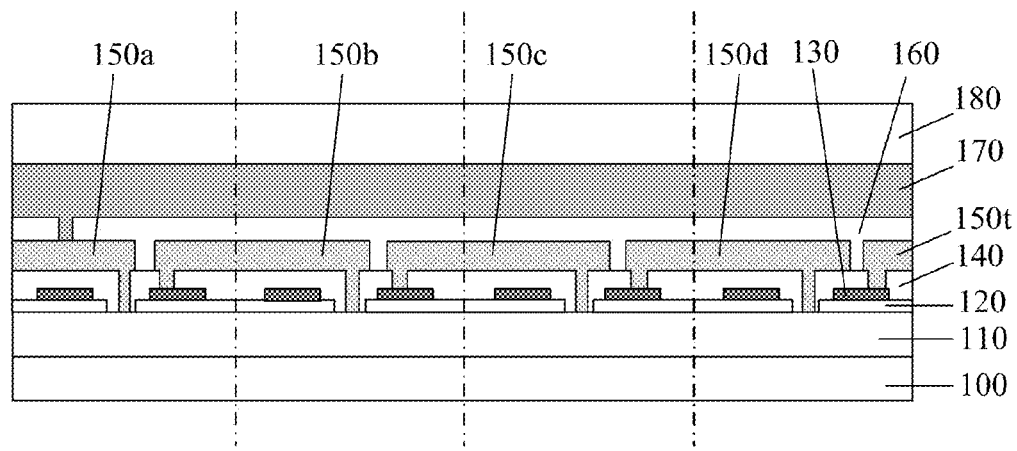

Referring to FIG. 15, the method for manufacturing a high voltage LED flip chip further includes forming a conductive plate 180 on the second electrode 170.

In some embodiments, the second electrode 170 and the conductive plate 180 may be connected by way of bonding or any other suitable way. The conductive plate 180 may be made of metal or any other conductive material. In some embodiments, the conductive plate 180 can also conduct heat.

Accordingly, when the second electrode 170 and the conductive plate 180 are connected, the conductive plate 180 is electrically connected with the second electrode 170. Therefore, the conductive plate 180 can serve as a P-electrode of the LED flip chip.

In some embodiments, the conductive plate 180 may be both electric conductive and heat conductive. The conductive plate 180 may be made of Si (Silicon), metal or any other conductive material.

Figure 16:
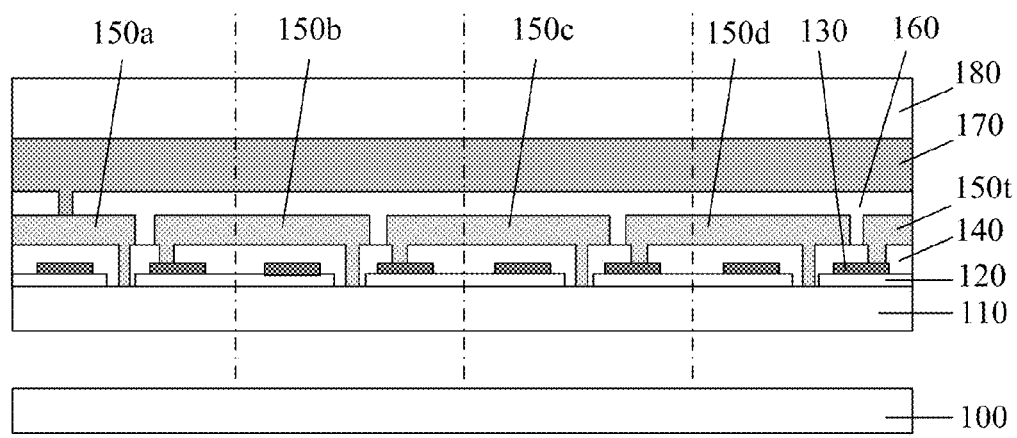

Referring to FIG. 16, the method for manufacturing a high voltage LED flip chip further includes separating the epitaxy stacking layer and the substrate 100 for exposing a surface of the first semiconductor layer 110.

In some embodiments, the epitaxy stacking layer and the substrate 100 may be separated from each other by chemical processing, mechanical processing, laser cutting or any other suitable method. The surface of the first semiconductor layer 110 being exposed after the separation process serves as a light-emitting surface.

Figure 17:
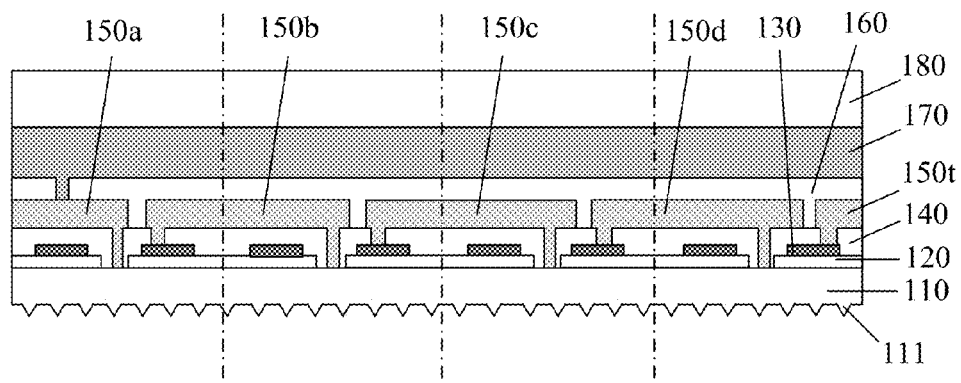

Referring to FIG. 17, the method for manufacturing a high voltage LED flip chip further includes implementing at least one of a cleaning process and a surface roughing process to the light-emitting surface after a surface of the first semiconductor layer 110 (i.e., the light-emitting surface) is exposed and before the light-emitting surface is etched to form an eighth groove (as illustrated below).

In some embodiments, the cleaning process implemented to the light-emitting surface includes dry etching, wet etching or a combination thereof.

In some embodiments, after the surface roughing is implemented to the light-emitting surface, protrusions 111 are formed. Thus, the light-emitting surface is an uneven surface. Then the cleaning process may be further implemented to the uneven surface. Surface roughing is performed to avoid total reflection at the interface between the light-emitting surface and ambient air, so as to increase amount of light emitting from the chip and improve light-extracting rate. The protrusion 111 may have a shape of truncated pyramid or a shape of cone, so as to improve luminous efficiency of the LED chip. For a truncated pyramid, four side surfaces of the protrusion 111 are not parallel with each other. As such, light reaching the side surface of the protrusion 111 is reflected back to a top surface of the protrusions 111 and emitted from the top surface of the protrusion 111. Accordingly, luminous efficiency of the LED chip is improved.

Accordingly, through cleaning and surface roughing processes, performance (e.g., light light-extracting rate) of the LED flip chip is improved. However, it should be noted that, in some embodiments, either the cleaning or the surface roughing is performed to the light-emitting surface of the first semiconductor layer 110. In some embodiments, the light-emitting surface may be performed without the cleaning and the surface roughing treatment.

Figure 18:
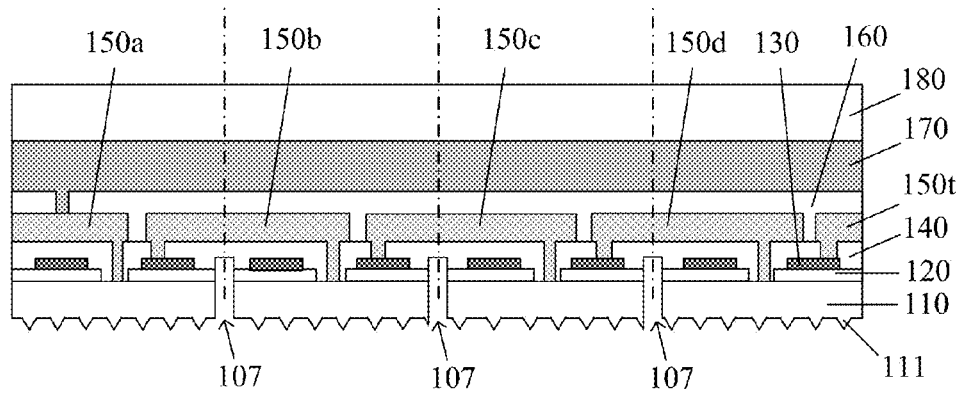

Referring to FIG. 18, the method for manufacturing a high voltage LED flip chip further includes etching the first semiconductor layer 110 to form a seventh groove 107. The seventh groove 107 insulates the epitaxy stacking layers (i.e., the first semiconductor layer 110, the quantum well layer and the second semiconductor layer 120) in different regions.

In some embodiments, the seventh groove 107 is formed by selectively etching the first semiconductor layer 110 using a mask (not shown).

As shown in FIG. 18, the dotted line for distinguishing two adjacent regions is located in the seventh groove 107. Therefore, when the seventh groove 107 penetrates the first semiconductor layer 110, the quantum well layer and the second semiconductor layer 120, the epitaxy stacking layers (i.e., the first semiconductor layer 110, the quantum well layer and the second semiconductor layer 120) in different regions are electrically insulated.

Referring to FIG. 19, the method for manufacturing a high voltage LED flip chip further includes etching the first semiconductor layer 110 to form an eighth groove 108. In some embodiments, given the sixth groove 106 for forming the upper electrode exposes the interconnection electrode 150a on the first side and the interconnection electrode 150a is electrically connected with the first semiconductor layer 110 on the first side, the eighth groove 108 exposes the first electrode 130 on the second side for forming a lower electrode.

In some embodiments, the sixth groove exposes the interconnection electrode on the first side, and the interconnection electrode on the first side is electrically connected with the first electrode on the first side. In this case, the eighth groove exposes the interconnection electrode on the second side.

In some embodiments, the sixth groove exposes the interconnection electrode on the second side, and the interconnection electrode on the second side is electrically connected with the first semiconductor layer on the second side. In this case, the eighth groove exposes the first electrode on the first side.

In some embodiments, the sixth groove exposes the interconnection electrode on the second side, and the interconnection electrode on the second side is electrically connected with the first electrode on the second side. In this case, the eighth groove exposes the interconnection electrode on the first side.

In some embodiments, a method for forming the eighth groove 108 is the same with that for forming the seventh groove 107. Further, the eighth groove 108 exposes the corresponding interconnection electrode or the first electrode 130, so as to make the following packaging process easy be implemented.

Figure 20:
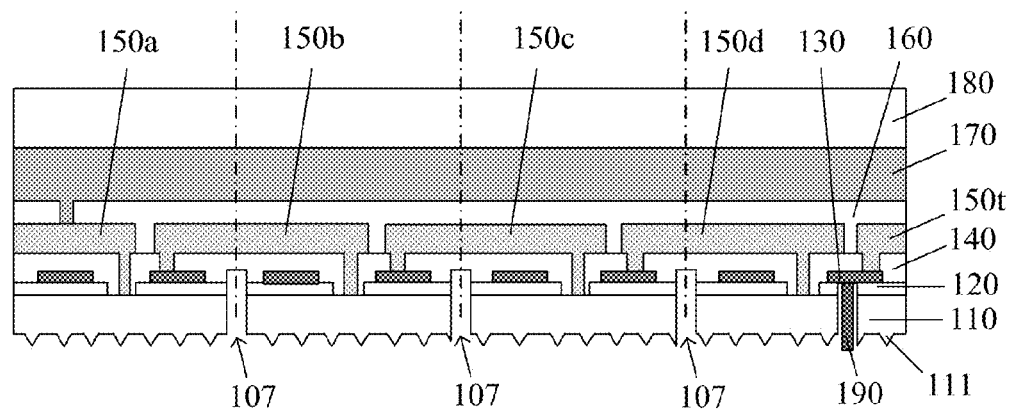

Referring to FIG. 20, the method for forming a high voltage LED flip chip further includes forming an extension electrode 190 on a surface of the first electrode 130 being exposed by the eighth groove 108.

In some embodiments, the eighth groove exposes the interconnection electrode. In this case, the extension electrode is formed on a surface of the interconnection electrode being exposed by the eighth groove.

In some embodiments, the extension electrode 190 is formed by deposition at the corresponding position (e.g., the surface of the first electrode being exposed by the eighth groove, or the surface of the interconnection electrode being exposed by the eighth groove). Material used in the deposition process is different from that of the first electrode or the interconnection electrode.

In some embodiments, after the extension electrode 190 is formed, a passive film may be further formed on the light-emitting surface of the LED flip chip. In some embodiments, there may be no extension electrode being formed. In this case, the first electrode 130 or the interconnection electrode is exposed and can be connected with corresponding wires in the following packaging process by way of wire routing.

It can be seen that, in the method for manufacturing a high voltage LED flip chip provided by the present disclosure, an epitaxy stacking layer including the first semiconductor layer 110, the quantum well electrode 310 and the second semiconductor layer 120 is formed on the substrate 100. Then, the epitaxy stacking layer is etched to form at least one first groove in each region, wherein the first groove exposes the first semiconductor layer 110 and the remaining portion of the epitaxy stacking layer in each region serves as a Mesa-platform. Then, a first electrode 130 is formed on the Mesa-platforms in each of the regions, wherein an area between the first electrodes 130 in two adjacent regions forms a second groove 102. Then, a first insulation layer 140 is formed, wherein the first insulation layer 140 covers the first electrode 130 and the Mesa-platform, and fills the second groove 102 and partially fills the first groove 101, wherein a part of the first groove 101 not being filled is a third groove 103. Then, etching the first insulation layer 140 to form at least one fourth groove 104, wherein the fourth groove 104 exposes a surface of the first electrode 130. Then, forming the interconnection electrodes (e.g., the interconnection electrode 150a, the interconnection electrode 150b, interconnection electrode 150c and interconnection electrode 150d), wherein the interconnection electrode fills the third groove 103 and the fourth groove 104 and each two adjacent interconnection electrodes form a fifth groove 105. With respect to two adjacent regions, the interconnection electrode connects the first electrode 130 in one of the two adjacent regions with the first semiconductor layer 110 of another one of the two adjacent regions. As the interconnection electrode may have a large thickness, and parts of the interconnection electrode filling the third groove 103 and the fourth groove 104 may have a large width, therefore the interconnection electrode is not easy to be broken. Moreover, with configuration of the interconnection electrodes, the first electrode 130 in one region and the first semiconductor layer 110 in another region are connected. Accordingly, in the method for manufacturing a high voltage LED flip chip, different regions are connected in series by the interconnection electrodes. As such, no more conventionally used metal wire is needed to bridge the regions. Therefore, break of the electrical connections (i.e., the metal wire) between different regions can be avoid, which results in an improved package yield.

Moreover, the entire second electrode 170, together with the conductive plate 180 in connection with the second electrode 170, serves as a terminal for electrical connection. In such a way, performance such as conductivity and heat dissipation of the chip is enhanced, packaging difficulty is reduced and package yield is improved.

The present disclosure further provides a high voltage LED flip chip, wherein the high voltage LED flip chip is manufactured by the method as described before. Therefore, structures of the high voltage LED flip chip can be obtained by referring to illustration described above in combination with the FIGS. 1 to 20.

Specifically, the high voltage LED flip chip includes four regions. Each of the four regions includes a Mesa-platform, wherein the Mesa-platform includes a first semiconductor layer 110, a quantum well layer 310 and a second semiconductor layer 120, wherein the Mesa-platform in each region has a first groove 101. The high voltage LED flip chip further includes a first electrode 130 located on the Mesa-platform, wherein an area between two adjacent first electrodes 130 forms a second groove 102. The high voltage LED flip chip further includes a first insulation layer covering the Mesa-platform and the first electrode 130, wherein the first insulation layer 140 fills the second groove 102 and partially fills the first groove 101, wherein a part of the first groove 101 which is not filled with the first insulation layer 140 forms a third groove 103. The first insulation layer 140 has a fourth groove 104, wherein the fourth groove 104 exposes the first electrode 130. The high voltage LED flip chip further includes an interconnection electrode (e.g., including an interconnection electrode 150a, an interconnection electrode 150b, an interconnection electrode 150c and an interconnection electrode 150d), wherein the interconnection electrode fills the third groove 103 and the fourth groove 104, and a fifth groove 105 is formed between two adjacent regions. Further, the interconnection electrode connects the first electrode 130 in one region and the first semiconductor layer 110 in an adjacent region.

In some embodiments, the first insulation layer 140 may include at least one material selected from a group consisting of $SiO_2$, SiN, SiON, $Al_2O_3$ and $TiO_2$.

In some embodiments, the interconnection electrode 150a on a first side electrically connects with the first semiconductor layer 110 in the region on the first side. In other words, the interconnection electrode 150a is electrically connected with the first semiconductor layer 110 in the region I.

In some embodiments, the interconnection electrode on the second side electrically connects with the first semiconductor layer 110 in the region on the second side.

In some embodiments, the high voltage LED flip chip further includes a second insulation layer 160, wherein the second insulation layer 160 covers the interconnection electrode and fills the fifth groove 105.

In some embodiments, the second insulation layer 160 may include at least one material selected from a group consisting of $SiO_2$, SiN, SiON, $Al_2O_3$ and $TiO_2$.

In some embodiments, the high voltage LED flip chip further includes a sixth groove 106 located on the second insulation layer 160, wherein the sixth groove 106 exposes one of the interconnection electrodes. In some embodiments, the sixth groove 106 exposes the interconnection electrode 150a on the first side. In some embodiments, the sixth groove may expose the interconnection electrode on the second side.

In some embodiments, the interconnection electrode may include at least one material selected from a group consisting of Ag, Al, Rh, Cr, Pt, Au, Ti and Ni.

In some embodiments, the high voltage LED flip chip further includes a second electrode 170, wherein the second electrode 170 covers the second insulation layer 160 and fills the sixth groove 106, and the second electrode 170 is electrically connected with a corresponding interconnection electrode through the sixth groove 106.

In some embodiments, the high voltage LED flip chip further includes a conductive plate 180 located on the second electrode 170.

In some embodiments, the high voltage LED flip chip further includes a seventh groove 107 located between two adjacent regions, wherein the seventh groove 107 at least insulates the first semiconductor layer 110, the quantum well layer 310 and the second semiconductor layer 120 in a particular region from that in another region adjacent to the particular region.

In some embodiments, the high voltage LED flip chip further includes an eighth groove 108 located on the first semiconductor layer 110. In some embodiments, the sixth groove 106 exposes the interconnection electrode 150a on the first side, and the interconnection electrode 150 is electrically connected with the first semiconductor layer 110 on the first side. In this case, the eighth groove 108 exposes the first electrode 130 on the second side.

In some embodiments, the high voltage LED flip chip further includes an extension electrode 190 located on the first electrode 130 being exposed by the eighth groove 108.

It should be noted that, in some embodiments, the sixth groove may expose the interconnection electrode on the first side, and the interconnection electrode on the first side may be electrically connected with the first electrode on the first side. In this case, the eighth groove exposes the interconnection electrode on the second side. In some embodiments, the sixth groove may expose the interconnection electrode on the second side, and the interconnection electrode on the second side may be electrically connected with the firs semiconductor layer on the second side. In this case, the eighth groove exposes the first electrode on the first side. In some embodiment, the sixth groove may expose the interconnection electrode on the second side, and the interconnection electrode on the second side may be electrically connected with the first electrode on the second side. In this case, the eighth groove exposes the interconnection electrode on the first side.

In some embodiments, the high voltage LED flip chip further includes a level-up electrode 150t, wherein the level-up electrode 150t and the interconnection electrode are formed on a same layer. In some embodiments, the extension electrode 190 is located on the first side, while the level-up electrode 150t is located on the outmost of the second side. In some embodiments, the extension electrode 190 is located on the second side, while the level-up electrode 150t is located on the outmost of the first side.

In some embodiments, a light-emitting surface on the first semiconductor layer 110 is an uneven surface.

Figure 21:
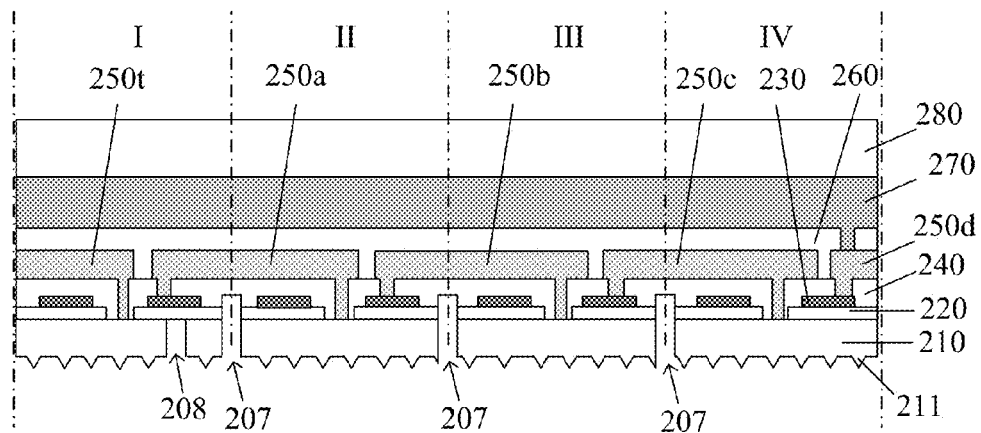
FIGS. 21 to 22 schematically illustrate intermediate structures of a high voltage LED flip chip in manufacturing according to another embodiment of the present disclosure.
Figure 22:
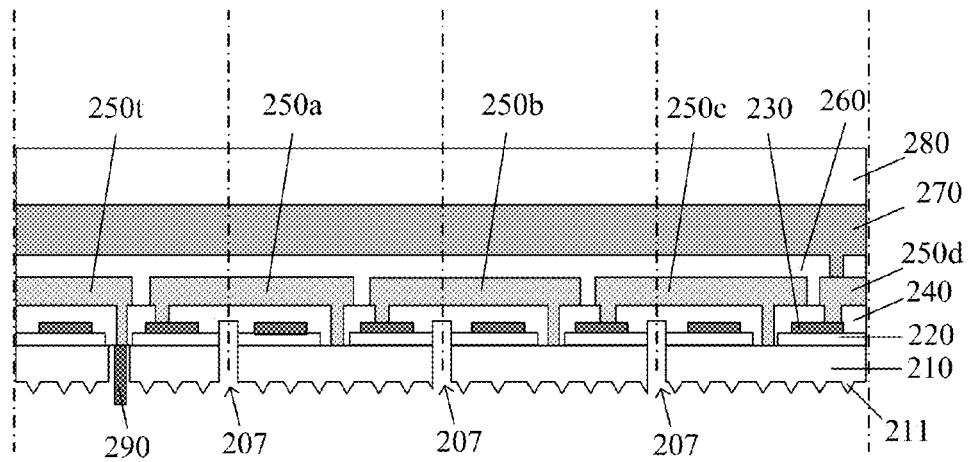

Referring to FIGS. 21 to 22, a method for manufacturing a high voltage LED flip chip according to another embodiment of the present disclosure is illustrated.

The method includes providing a substrate; and forming an epitaxy stacking layer on the substrate, wherein the epitaxy stacking layer includes a first semiconductor layer 210, a quantum well layer (not shown) and a second semiconductor layer 220. It should be noted that, these two steps are similar to that in the embodiments described above, thus corresponding illustrations in the above embodiments can be taken as reference.

Further, the substrate includes four regions which are respectively, from left to right, a region I, a region II, a region III and a region IV. As shown in FIG. 21, five dotted lines are applied to indicate the four different regions.

Continuing referring to FIG. 21, the method for manufacturing a high voltage LED flip chip further includes etching the epitaxy stacking layer to form at least one first groove (not shown in FIG. 21, corresponding illustration can refer to FIGS. 3 and 4). The first groove exposes the first semiconductor layer 210, and a remaining portion the epitaxy stacking layer in each region is defined as a Mesa-platform.

Continuing referring to FIG. 21, the method further includes forming a first electrode 203 on the Mesa-platform, wherein an area between the first electrodes 230 in two adjacent regions form a second groove (not shown in FIG. 21, corresponding illustration can refer to FIGS. 5 and 6).

Continuing referring to FIG. 21, the method further includes forming a first insulation layer 240, wherein the first insulation layer 240 covers the Mesa-platforms and the first electrodes 230, and wherein the first insulation layer 240 fills the second groove and partially fills the first groove, and a part of the first groove not being filled is defined as a third groove (not shown in FIG. 21, corresponding illustration can refer to FIGS. 7 and 8).

Moreover, the method further includes etching the first insulation layer 240 to form at least one fourth groove, wherein the fourth groove exposes a surface of the first electrode 230 (not shown in FIG. 21, corresponding illustration can refer to FIGS. 7 and 8).

Continuing referring to FIG. 21, the method further includes forming an interconnection electrode, wherein the interconnection electrode fills the third groove and the fourth groove, and wherein the interconnection electrodes in adjacent regions form a fifth groove therebetween (not shown in FIG. 21, corresponding illustration can refer to FIGS. 9 and 10). Further, the interconnection electrode connects the first electrode 230 in a particular region with the first semiconductor layer 210 on another region adjacent to the particular region.

In some embodiments, as there are four regions, four interconnection electrodes are formed. As shown in FIG. 21, these four interconnection electrodes are respectively, from left to right, an interconnection electrode 250a, an interconnection electrode 250b, an interconnection electrode 250c and an interconnection electrode 250d.

The interconnection electrode 250a connects the first electrode 230 in the region I with the first semiconductor layer 210 in the region II. The interconnection electrode 250b connects the first electrode 230 in the region II with the first semiconductor layer 210 in the region III. The interconnection electrode 250c connects the first electrode 230 in the region III with the first semiconductor layer 210 in the region IV.

In addition, the high voltage LED flip chip further includes an interconnection electrode 250d, wherein the interconnection electrode 250d is used for electrically connecting a second electrode 270 formed in the subsequent process. Further, the interconnection electrode 250d is electrically connected with the first electrode 230 in the region IV through the fourth groove in the region IV.

It should be noted that, in order to show a difference, the interconnection electrode (e.g., the interconnection electrodes 250a, 250b and 250c) connecting the electrode 230 in one region with the first semiconductor layer 210 in an adjacent region is defined as a first portion of the interconnection electrode. The interconnection electrode (e.g., the interconnection electrodes 250d) connecting with the first electrode 230 is defined as a third portion of the interconnection electrode.

In some embodiments, as shown in FIGS. 21 and 22, the left side is defined as a first side, while the right side is defined as a second side. In some embodiments, the interconnection electrode 250d on the second side is electrically connected with the first semiconductor layer 210 in the region on the second side. As such, chip units in the regions, which are formed in the subsequent processes, are connected.

It should be noted that, in some embodiments, the method further includes forming a level-up electrode 250t during the process of forming the interconnection electrodes.

From FIG. 21, it can be seen that, the level-up electrode 250t is formed on the first side. In some embodiments, the 250t locates on the outmost portion of the first side.

Continuing referring to FIG. 21, the method further includes forming a second insulation layer 260, wherein the second insulation layer 260 covers the interconnection electrode and the fifth groove, and the second insulation layer 260 is formed with a sixth groove thereon (not shown in FIG. 21, corresponding illustration can refer to FIGS. 11 and 12). The sixth groove exposes the interconnection electrode 250d located on the second side.

Continuing referring to FIG. 21, the method further includes forming a second electrode 270, wherein the second electrode 270 covers the second insulation layer 260 and fills the sixth groove.

Continuing referring to FIG. 21, the method further includes separating the epitaxy stacking layer and the substrate from each other to expose a surface of the first semiconductor layer 210, wherein the surface of the first semiconductor layer 210 being exposed is a light-emitting surface.

Continuing referring to FIG. 21, the method further includes, after the light-emitting surface is exposed and before the light-emitting surface is etched to form a seventh groove, implementing at least one of a cleaning process and a surface roughing process to the light-emitting surface.

Continuing referring to FIG. 21, the method further includes etching the first semiconductor layer 210 to form a seventh groove 207, wherein the epitaxy stacking layers (i.e., including the first semiconductor layer 210, the quantum well layer and the second semiconductor layer 220) in two adjacent regions are insulated by the seventh groove 207.

As shown in FIG. 21, the dotted line for distinguishing two adjacent regions is located in the seventh groove 207. Therefore, when the seventh groove 207 penetrates the first semiconductor layer 210, the quantum well layer and the second semiconductor layer 220, the epitaxy stacking layers (i.e., including the first semiconductor layer 210, the quantum well layer and the second semiconductor layer 220) in two adjacent regions are insulated by the seventh groove 207.

Continuing referring to FIG. 21, the method further includes etching the first semiconductor layer 210 to form an eighth groove 208. If the sixth groove exposes the interconnection electrode 250d on the second side, and the interconnection electrode 250d is electrically connected with the first electrode 230 on the second side, the eighth groove exposes interconnection electrode 250t on the first side.

Referring to FIG. 22, the method may further include forming an extension electrode 290 on a surface of interconnection electrode 250t being exposed by the eighth groove 208. Accordingly, as the extension electrode 290 connects with the interconnection electrode 250t, and the interconnection electrode 250t connects with the first semiconductor layer 210 in the region I through the third groove 103, a voltage can be applied to the first semiconductor layer 210 through the extension electrode 290.

It should be noted that, in some embodiments, after the extension electrode 290 is formed, a passive film may be further formed on the light-emitting surface of the LED flip chip. In some embodiments, there may be no extension electrode being formed. In this case, the first electrode 230 or the interconnection electrode being exposed can connect with corresponding wires in the following packaging process by way of wire routing.

It can be seen that, in the method for manufacturing a high voltage LED flip chip provided by the present disclosure, an epitaxy stacking layer including the first semiconductor layer 210, the quantum well layer and the second semiconductor layer 220 is formed on the substrate 100. Then, the epitaxy stacking layer is etched to form at least one first groove in each region, wherein the first groove exposes the first semiconductor layer 110 and the remaining portion of the epitaxy stacking layer in each region serves as a Mesa-platform. Then, a first electrode 230 is formed on each of the Mesa-platforms, wherein an area between the first electrodes 230 in two adjacent regions forms a second groove 202. Then, a first insulation layer 240 is formed, wherein the first insulation layer 240 covers the first electrode 230 and the Mesa-platform, and fills the second groove 202 and partially fills the first groove 101, wherein a part of the first groove 201 which is not filled is a third groove 203. Then, etching the first insulation layer 240 to form at least one fourth groove 204, wherein the fourth groove 204 exposes a surface of the first electrode 230. Then, forming an interconnection electrode, wherein the interconnection electrode fills the third groove 203 and the fourth groove 204 and each two adjacent interconnection electrodes forms a fifth groove 205. The interconnection electrode connects the first electrode 230 in one region and the first semiconductor layer 210 in an adjacent region. Moreover, as the interconnection electrode fills the third groove and the fourth groove, the first electrode 230 in a particular region is connected with the first semiconductor layer in another region adjacent to the particular region. Accordingly, in the method for manufacturing a high voltage LED flip chip, different regions are connected by the interconnection electrode. As such, no more conventionally used metal wire is needed to bridge the regions. Therefore, break of the electrical connections (i.e., the metal wire) between different regions may be avoid, which may result in an increased packaging yield.

Moreover, the entire second electrode 270, together with the conductive plate 280 in connection with the second electrode 270, serves as a terminal for electrical connection. In such a way, performance such as conductivity and heat dissipation of the chip is enhanced, difficulty in packaging process can be lowered and yield rate of the packaging process can be improved.

The present disclosure further provides a high voltage LED flip chip, wherein the high voltage LED flip chip is manufactured by the method as described above. Therefore, structures of the high voltage LED flip chip can be obtained by referring to description above in combination with the FIGS. 21 and 22.

Specifically, as shown in FIG. 22 in combination with FIGS. 1 to 20, the high voltage LED flip chip includes four regions. Each of the four regions includes a Mesa-platform, wherein the Mesa-platform includes a first semiconductor layer 210, a quantum well layer and a second semiconductor layer 220, wherein the Mesa-platform in each region has a first groove 201. The high voltage LED flip chip further includes a first electrode 230 located on the Mesa-platform, wherein the area between two adjacent first electrodes 230 forms a second groove 202 therebetween. The high voltage LED flip chip further includes a first insulation layer 240 covering the Mesa-platform and the first electrode 230, wherein the first insulation layer 240 fills the second groove 202 and partially fills the first groove 201, and a part of the first groove 201 which is not filled with the first insulation layer 240 forms a third groove 203. The first insulation layer 240 has a fourth groove 204, wherein the fourth groove 204 exposes the first electrode 230. The high voltage LED flip chip further includes an interconnection electrode, wherein the interconnection electrode fills the third groove 203 and the fourth groove 204, and a fifth groove 205 is formed between two adjacent regions. Further, the interconnection electrode connects the first electrode 230 in one region and the first semiconductor layer 210 in an adjacent region.

In some embodiments, the first insulation layer 240 may include at least one material selected from a group consisting of $SiO_2$, SiN, SiON, $Al_2O_3$ and $TiO_2$.

In some embodiments, the interconnection electrode on a first side electrically connects with the first semiconductor layer 210 of the region on the first side. In other words, the interconnection electrode is electrically connected with the first semiconductor layer 210 of the region.

In some embodiments, the interconnection electrode on the second side electrically connects with the first semiconductor layer 210 of the region on the second side.

In some embodiments, the high voltage LED flip chip further includes a second insulation layer 260, wherein the second insulation layer 260 covers the interconnection electrode and fills the fifth groove.

In some embodiments, the second insulation layer 260 may include at least one material selected from a group consisting of $SiO_2$, SiN, SiON, $Al_2O_3$ and $TiO_2$.

In some embodiments, the high voltage LED flip chip further includes a sixth groove located on the second insulation layer 260, wherein the sixth groove exposes one of the interconnection electrodes. In some embodiments, the sixth groove exposes the interconnection electrode on the first side. In some embodiments, the sixth groove may expose the interconnection electrode on the second side.

In some embodiments, the interconnection electrode may include at least one material selected from a group consisting of Ag, Al, Rh, Cr, Pt, Au, Ti and Ni.

In some embodiments, the high voltage LED flip chip further includes a second electrode 270, wherein the second electrode 270 covers the second insulation layer 260 and fills the sixth groove 206, and the second electrode 270 is electrically connected with a corresponding interconnection electrode (e.g., the interconnection electrode 250d) through the sixth groove 206.

In some embodiments, the high voltage LED flip chip further includes a conductive plate 280 located on the second electrode 270.

In some embodiments, the high voltage LED flip chip further includes a seventh groove 207 located between two adjacent regions, wherein the seventh groove 207 at least insulates the first semiconductor layer 210, the quantum well layer and the second semiconductor layer 220 of one region from that of an adjacent region.

In some embodiments, the high voltage LED flip chip further includes an eighth groove 208 penetrates the first semiconductor layer 210. In some embodiments, the sixth groove exposes the interconnection electrode 250d on the second side, and the interconnection electrode 250d is electrically connected with the first electrode 230 on the second side. In this case, the eighth groove 208 exposes interconnection electrode 250t on the first side.

In some embodiments, the high voltage LED flip chip further includes an extension electrode 290 located on the first electrode 230 or the interconnection electrode 250t being exposed by the eighth groove 208.

In some embodiments, the high voltage LED flip chip further includes a level-up electrode 250t, wherein the level-up electrode 250t is located on the same layer with the interconnection electrodes.

In some embodiments, the light-emitting surface is a rough surface.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A high voltage LED flip chip, comprising:
   two or more regions, wherein the two or more regions comprise a first region where an upper electrode is to be formed and a second region where a lower electrode is to be formed;
   a Mesa-platform comprising a first semiconductor layer, a quantum well layer and a second semiconductor layer, wherein the Mesa-platform in each of the two or more regions has a first groove;
   a first electrode located on the Mesa-platform, wherein an area between the first electrodes in two adjacent regions forms a second groove;
   a first insulation layer, wherein the first insulation layer covers the Mesa-platforms and the first electrodes, the first insulation layer fills the second groove and partially fills the first groove, and a part of the first groove which is not filled forms a third groove;
   a fourth groove formed in the first insulation layer, wherein the fourth groove exposes a surface of the first electrode;
   an interconnection electrode, wherein the interconnection electrode comprises a first portion connecting the first semiconductor layer through the third groove in a particular region with the first electrode through the fourth groove in another region adjacent to the particular region, the interconnection electrode further comprises a second portion connecting with the first semiconductor layer in the first region and a third portion connecting with the first electrode in the second region, wherein a fifth groove is formed between two adjacent portions of the interconnection electrode;
   a second insulation layer, wherein the second insulation layer covers the interconnection electrode and fills the fifth groove;
   a sixth groove formed in the second insulation layer, wherein the sixth groove exposes the interconnection electrode in the second region;
   a second electrode, wherein the second electrode covers the second insulation layer and connects with the interconnection electrode through the sixth groove in the second region;
   a conductive plate located on the second electrode;
   a seventh groove formed between adjacent regions, wherein the seventh groove partitions the first semiconductor layers, the quantum well layers and the second semiconductor layers in different regions; and
   an eighth groove formed in the first semiconductor, wherein the eighth groove exposes the interconnection electrode in the first region.

2. A high voltage LED flip chip, comprising:
   two or more regions, wherein the two or more regions comprise a first region where an upper electrode is to be formed and a second region where a lower electrode is to be formed;
   a Mesa-platform comprising a first semiconductor layer, a quantum well layer and a second semiconductor layer, wherein the Mesa-platform in each of the two or more regions has a first groove;
   a first electrode located on the Mesa-platform, wherein an area between the first electrodes in two adjacent regions forms a second groove;
   a first insulation layer, wherein the first insulation layer covers the Mesa-platforms and the first electrodes, the first insulation layer fills the second groove and partially fills the first groove, and a part of the first groove which is not filled forms a third groove;
   a fourth groove formed in the first insulation layer, wherein the fourth groove exposes a surface of the first electrode;
   an interconnection electrode, wherein the interconnection electrode comprises a first portion connecting the first semiconductor layer through the third groove in a particular region with the first electrode through the fourth groove in another region adjacent to the particular region, the interconnection electrode further comprises a second portion connecting with the first semiconductor layer in the first region and a third portion connecting with the first electrode in the second region, wherein a fifth groove is formed between two adjacent portions of the interconnection electrode;
   a second insulation layer, the second insulation layer covers the interconnection electrode and fills the fifth groove;
   a sixth groove formed in the second insulation layer, the sixth groove exposes the interconnection electrode in the first region;
   a second electrode, wherein the second electrode covers the second insulation layer and connects with the interconnection electrode through the sixth groove in the first region
   a conductive plate located on the second electrode;
   a seventh groove formed between the two adjacent regions, wherein the seventh groove partitions the first semiconductor layers, the quantum well layers and the second semiconductor layers in different regions;
   an eighth groove formed in the first semiconductor, wherein the eighth groove exposes the first electrode in the second region; and
   an extension electrode, wherein the extension electrode connects with the first electrode exposed by the eighth groove.

3. The high voltage LED flip chip according to claim 1, further comprising an extension electrode, wherein the extension electrode connects with the interconnection electrode exposed by the eighth groove.

4. The high voltage LED flip chip according to claim 1, wherein the first semiconductor layer has a rough light-emitting surface.

5. The high voltage LED flip chip according to claim 1, wherein the interconnection electrode comprises at least one material selected from a group consisting of Ag, Al, Rh, Cr, Pt, Au, Ti and Ni.

6. The high voltage LED flip chip according to claim 1, wherein the first insulation layer comprises at least one material selected from a group consisting of $SiO_2$, SiN, SiON, $Al_2O_3$ and $TiO_2$.

7. The high voltage LED flip chip according to claim 1, wherein the second insulation layer comprises at least one material selected from a group consisting of $SiO_2$, SiN, SiON, $Al_2O_3$ and $TiO_2$.

8. The high voltage LED flip chip according to claim 2, wherein the second insulation layer comprises at least one material selected from a group consisting of $SiO_2$, SiN, SiON, $Al_2O_3$ and $TiO_2$.

9. The high voltage LED flip chip according to claim 2, wherein the first semiconductor layer has a rough light-emitting surface.

10. The high voltage LED flip chip according to claim 2, wherein the interconnection electrode comprises at least one material selected from a group consisting of Ag, Al, Rh, Cr, Pt, Au, Ti and Ni.

11. The high voltage LED flip chip according to claim 2, wherein the first insulation layer comprises at least one material selected from a group consisting of $SiO_2$, SiN, SiON, $Al_2O_3$ and $TiO_2$.

* * * * *